United States Patent [19]

Jordan et al.

[11] Patent Number: 4,882,370
[45] Date of Patent: Nov. 21, 1989

[54] FIBER REINFORCED COMPOSITES WITH IMPROVED GLASS TRANSITION TEMPERATURES

[75] Inventors: Robert C. Jordan; Gene B. Portelli, both of St. Paul, Minn.

[73] Assignee: Minnesota Mining and Manufacturing Company, St. Paul, Minn.

[21] Appl. No.: 149,101

[22] Filed: Jan. 27, 1988

[51] Int. Cl.$^4$ .......................... C08K 7/10; C08K 7/04; C08L 63/00

[52] U.S. Cl. .................................. 523/215; 523/200; 523/427; 523/428; 523/435; 523/448; 523/466; 523/468

[58] Field of Search .................. 528/97; 523/200, 215, 523/427, 428, 435, 448, 466, 468; 525/438, 423

[56] References Cited

U.S. PATENT DOCUMENTS

| | | | |
|---|---|---|---|
| 4,331,582 | 5/1982 | Babayan | 523/453 |
| 4,447,512 | 5/1984 | Rowe et al. | 430/17 |
| 4,521,583 | 6/1985 | Kohli | 528/119 |
| 4,636,535 | 1/1987 | Wang et al. | 523/204 |
| 4,656,207 | 4/1987 | Jabloner et al. | 523/400 |
| 4,684,678 | 8/1987 | Schultz et al. | 523/466 |
| 4,707,534 | 11/1987 | Schultz | 528/97 |

OTHER PUBLICATIONS

Korshak et al., Vysolomol. Soedin, Ser. A 13(1), 150–155, (1971).
Chen et al., J. Appl. Poly. Sci., 27, 3289–3312, (1982).
Holloway, M. S., Thesis, San Jose State, San Jose, Calif., Aug. 1984, pp. ii, iii, iv, 5, 6, 14, 18–20, 22, 23.
Keck, F. L., NASA Contract NAS2-10130 (Report 166501) (1983).

Primary Examiner—Lewis T. Jacobs
Attorney, Agent, or Firm—Donald M. Sell; Walter N. Kirn; Lorraine R. Sherman

[57] ABSTRACT

A fiber reinforced composite structure having a glass transition temperature greater than 150° C. is comprised of:
a) reinforcing fiber and
b) a curable epoxy resin composition comprising
 (i) one or more epoxides having more than one epoxide group per molecule, of which epoxides at least 10 percent by weight is a 9,9-bis[4-(2,3-epoxypropoxy)phenyl]fluorene, all of the fluorene epoxy present being free of ortho substitution;
 (ii) an effective amount of one or more epoxy curing agents.

25 Claims, No Drawings

FIBER REINFORCED COMPOSITES WITH IMPROVED GLASS TRANSITION TEMPERATURES

FIELD OF THE INVENTION

The present invention relates to composite structures comprising fibers reinforced with curable epoxy resin compositions. These composite structures find utility as structural components in the aerospace industry, and in the electronics industry, for example as printed wiring boards.

BACKGROUND OF THE INVENTION

Advanced composites are high strength, high modulus materials which have found extensive use as structural components in the aerospace, automotive, electronics, and sporting goods industries. Typically they are comprised of structural filaments such as carbon (graphite), glass, boron and the like, in the form of bundles (fibers) or non-woven mats, or woven fibers (fabric), embedded in a thermosetting resin matrix.

A common method of preparing composite structures is hot melt prepregging. This process is characterized by impregnating bundles or fabrics of continuous fiber with a thermosetting resin composition in molten form to yield a prepreg, which is then layed up and cured to provide a composite of fiber and thermoset resin. In the prepreg stage the resin may be either uncured or partially cured. Resin systems containing a polyepoxide resin and an aromatic amine hardener are often used in prepregging since they possess the balance of properties required for this composite fabrication process.

Other processing techniques have been used to form fiber reinforced composites. For example, filament winding, solvent prepregging, and pultrusion are typical processing techniques in which an uncured epoxy resin composition can be used.

These composites have been made using a wide range of epoxy resin compositions. U.S. Pat. Nos. 4,331,582; 4,447,512; 4,521,583; 4,636,535; and 4,656,207 exemplify this. The matrix resins are frequently required to possess high glass transition temperatures ($T_g$) upon curing in order to maintain the structural properties and integrity of the composite at the elevated temperatures frequently encountered during manufacturing, testing, or operation.

Epoxy resins containing 9,9-bis[4-(2,3-epoxypropoxy)phenyl]fluorene have been investigated with regard to their thermal stability, heat resistance, and flammability in the following disclosures: Korshak et al., Vysokomol. Soedin, Ser. A 13(1), 150–155 (1971); Chen et al., J. Appl. Poly. Sci., 27, 3289–3312 (1982); and Holloway, M.S. Thesis, San Jose State, San Jose, California, August 1984, pp. ii, iii, iv, 5, 6, 14, 18–20, 22, 23. None of the above references disclose the use of 9,9-bis[4-(2,3-epoxypropoxy)phenyl]fluorene as a component of a matrix resin in fiber reinforced composites.

Compositions containing ortho-substituted 9,9-bis[4-(2,3-epoxypropoxy)phenyl]fluorenes and the impregnation of substrates with these compositions is disclosed in U.S. Pat. No. 4,707,534.

Fiber reinforced composites which include 9,9-bis[4-(2,3-epoxypropoxy)phenyl]fluorene in the matrix resin are described by Keck in NASA Contract NAS2-10130 (Report 166501)(1983), and in U.S. Pat. No. 4,684,678. Keck reports low $T_g$ values (<110° C) for resin systems cured with trimethoxyboroxine or a novolac phenolic.

U.S. Pat. No. 4,684,678 claims high $T_g$ matrix resins by virtue of using fluorene amine curing agents. It is not disclosed or suggested how resins having a high $T_g$ can be obtained without the use of a fluorene amine curative.

SUMMARY OF THE INVENTION

Briefly, the present invention provides fiber reinforced composite structures with a $T_g$ greater than 150° C comprised of:
  (a) reinforcing fiber (woven or non-woven), and
  (b) a curable epoxy resin composition comprising
    (1) one or more epoxides having more than one epoxide group per molecule, of which epoxides at least 10 percent by weight is a 9,9-bis[4-(2,3-epoxypropoxy)phenyl]fluorene either unsubstituted or substituted by one or more halogen atoms, all of the fluorene epoxy present being free of ortho substitution;
    (2) one or more epoxy curing agents; preferably these are selected from polybasic carboxylic acids and their anhydrides; Lewis acids and their blocked derivatives; aliphatic, cycloaliphatic, and aromatic amines; carboxylic acid amides; and melamines; all in an amount sufficient to effect curing, and
    (3) optionally, one or more additives which may be included for the purpose of providing desirable changes in the mechanical, thermal, or processing characteristics of said composition.

Composite articles of the invention possess improved $T_g$ values as compared to composites which do not contain 9,9-bis[4-(2,3-epoxypropoxy)phenyl]fluorene or a halogenated derivative thereof, as a polyepoxide component. This increase in $T_g$ provides improved retention of the structural properties and integrity of the composite when it is exposed to elevated temperatures, such as during manufacture, testing, or operation. Glass transition temperatures of the invention are greater than 150° C.

Universal agreement of the terminology to be used in the field of epoxy resins has not been reached. The term "epoxy resin" has been used to indicate not only molecules containing at least one group having a three-membered ring of which one member is oxygen but also the cured compositions in which the three-membered ring no longer exists. Within this application, the term "polyepoxide" means a molecule that contains more than one

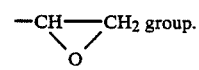

The term "epoxy resin" will be used to indicate uncured compositions comprising a polyepoxide, a curing agent, and other optional compounds that can be cured to a "cured epoxy resin".

DETAILED DESCRIPTION

The fiber resin matrix compositions according to the present invention can be prepared by embedding fibers, e.g., glass fibers, non-siliceous fibers, ceramic fibers, and/or synthetic organic fibers in a curable resin composition to form a fiber resin matrix which can be manipulated and cured to a solid composite. Particular selection of the fiber material, polyepoxide(s) and curing agent(s), as well as including optional additives such as fillers, dyes, thermoplastics, rubbery heterophases, processing aids, etc., can give a range of curable compositions heretofore unknown in the art and exhibiting improved glass transition temperatures over known materials.

Glass fibers useful herein are well known. Non-siliceous fiber composites may be of any non-glass, non-silicon dioxide-containing material which improves the strength or other physical properties of the curable epoxy resin component. Such fibers include, but are not limited to, fibers comprised of carbon, graphite, silicon carbide, boron, aramid such as poly(p-phenylene terephthalamide) (Kevlar ™, E. I. duPont de Nemours and Co., Inc.), polyester, polyamide, ceramic fibers such as Nextel ™ 312 (3M Co.), rayon, polybenzimidazole, polybenzothiazole, and metal coated such fibers, for example nickel-coated and/or silver-coated graphite fibers and filaments, or combinations of such fibers. Woven or non-woven fibers and filaments, or tapes (unwoven, flat bundles) of these may be employed as desired.

Preferably, the curable epoxy resin composition comprises:

(1) a polyepoxide component comprised of 10 to 100 percent by weight of a 9,9-bis[4-(2,3-epoxypropoxy)phenyl]fluorene which is free of ortho substitution, or a halogenated derivative thereof, and 90 to 0 percent by weight of at least one non fluorene-containing polyepoxide, and (2) an epoxy resin curing component comprised of one or more epoxy curing agents, including polybasic acids and their anhydrides; Lewis acids and bases, and their blocked derivatives; benzylamine; aliphatic and cycloaliphatic amines; tertiary aromatic amines; amides; melamines; and specified primary aromatic polyamines; the curing agent being present in an amount for effecting polymerization, and optionally (3) additives which might provide desirable changes in the mechanical, thermal or processing characteristics of said composition.

The 9,9-bis[4-(2,3-epoxypropoxy)phenyl]fluorene of use in the epoxy mixture of the invention has an epoxy equivalent weight of up to about 600 and the formula:

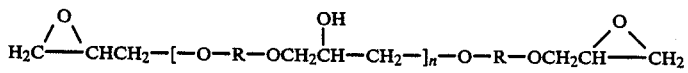

wherein
n is a number having a value 0 to 3, preferably n is zero, and
R is a divalent organic group having the formula

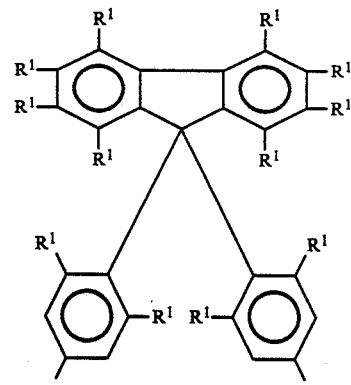

wherein each $R^1$ is independently hydrogen, halogen or lower alkyl ($C_1$ to $C_4$).

The curable composition of the invention contains 10 to 100 percent, preferably 25 to 100 percent, by weight of the above defined diglycidyl ethers and correspondingly 90 to 0 percent, preferably 75 to 0 percent, by weight of other nonfluorene-containing polyepoxides.

The polyepoxides suitable for the present invention are compounds in which there is present more than one epoxy group, e.g.,

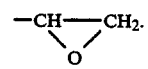

Such polyepoxides include, but are not limited to, polyglycidyl ethers of aliphatic polyols, such as glycerol or hydrogenated 4,4'-dihydroxydiphenyl-dimethylmethane; cycloaliphatic polyepoxides, such as (3,4-epoxycyclohexylmethyl)-3,4-epoxycyclohexane carboxylate (ERL ™-4221, Union Carbide Corp.) and bis(3,4-epoxy-6-methylcyclohexylmethyl)adipate (ERL ™-4299, Union Carbide Corp.); polyglycidyl ethers of polyhydric phenols, for example pyrocatechol; resorcinol; hydroquinone; 4,4'-dihydroxydiphenyl methane; 4,4'-dihydroxydiphenyl dimethyl methane; 4,4'-dihydroxy-3,3'-dimethyldiphenyl methane; 4,4'-dihydroxydiphenyl methyl methane; 4,4'-dihydroxydiphenyl cyclohexane; 4,4'-dihydroxy-3,3'-dimethyldiphenyl propane; 4,4'-dihydroxydiphenyl sulfone; or tris-(4-hydroxyphenyl)methane; polyglycidyl ethers of the halogenation (e.g., chlorination and bromination) products of the above mentioned polyvalent phenols; and polyglycidyl ethers of novolacs (i.e., reaction products of monohydric or polyhydric phenols with aldehydes, formaldehyde in particular, in the presence of acid catalysts).

Other suitable compounds include the di- and polyglycidyl derivatives of aromatic amines obtained from the reaction between these aromatic amines and an epihalohydrin. Examples of such glycidylamines include, but are not limited to, N,N'-diglycidyl aniline; N,N'-dimethyl-N,N'-diglycidyl-4,4'-diaminodiphenyl methane; N,N,N',N'-tetraglycidyl-4,4'-diaminodiphenyl methane (MY ™-720, Ciba-Geigy, Inc.); N,N-diglycidylnapthalenamine [given the name of N-1-napthalenyl-N-(oxiranylmethyl)oxiranemethanamine by Chemical Abstracts 9th Coll. 8505F (1982-1979)]; N,N,N'N'-tetraglycidyl-1,4-bis[α-(4-aminophenyl)-α-methylethyl]benzene (EPON HPT ™-1071, Shell Chemical Co.); and N,N,N',N'-tetraglycidyl-1,4-bis[α-(4-amino3,5-dimethylphenyl)-α-methylethyl]benzene (EPON HPT ™-1072, Shell Chemical Co.). The polyglycidyl derivatives of aromatic aminophenols (glycidylamino-glycidyloxy benzene) as described in U.S. Pat. No. 2,951,825 are also suitable.

An example of these compounds is N,N-diglycidyl-4-glycidyloxybenzenamine (ERL ™-0510, Ciba-Geigy, Inc.).

Glycidyl esters and/or epoxycyclohexyl esters of aromatic polycarboxylic acids, for example phthalic acid diglycidyl ester, and glycidyl esters of the reaction products of 1 mole of an aromatic dicarboxylic acid anhydride and ½ mole of a diol or 1/n mole of a polyol with n hydroxy groups are also suitable.

The diglycidyl ethers of 9,9-bis(4-hydroxyphenyl)-fluorene are prepared, in general, in two steps by procedures known in the art. In step 1 the condensation of a unsubstituted or halogenated phenol with fluorenone or halogenated fluorenone yields a 9,9-bis(4-hydroxyphenyl)fluorene which in step 2 is caused to react with an excess of epichlorohydrin to yield the diglycidyl ether of a 9,9-bis(4-hydroxyphenyl)fluorene (the unsubstituted derivative of which is herein called 9,9-bis[4-(2,3-epoxypropoxy)phenyl]fluorene).

Step 1 is carried out, preferably, by agitating in a reaction vessel containing fluorenone, halogenated fluorenone, or a mixture of said fluorenones, two or more equivalents (the excess above 2 equivalents being used as solvent) of phenol, halogenated phenol, or a mixture of said phenols and heating the mixture to 25 to about 125° C in the presence of 0.1 to 1.0 percent, by total weight, of 3-mercaptopropionic acid. The temperature of the agitating mixture is held at 25 to about 125° C until the disappearance of the carbonyl group as can be shown by infrared spectra, generally about 10 minutes to 10 hours. During the heating period anhydrous hydrogen chloride is passed through the agitating mixture until about 1 to 10 weight percent of hydrogen chloride, based on total weight, has been utilized. After the reaction period, the fluorene bisphenol reaction product is isolated by distillation of excess phenols and 3-mercaptopropionic acid, by chromatography, or preferably by charging into a water-soluble solvent for the phenol, such as methanol, ethanol, or acetone from which the fluorene bisphenol precipitates and may be purified, if desired, by working with solvent or redissolving and reprecipitating. Where mixed fluorene bisphenols are obtained, they may be separated into individual components by methods such as chromatography. It is preferable that the unseparated mixture of fluorene bisphenols be used in Step 2.

Step 2 can be carried out in a reaction vessel having means for agitation, adding fluids, and vacuum distillation. Into the vessel is added the fluorene bisphenol of Step 1, about 2 to 10 moles of epihalohydrin, preferably epichlorohydrin, per mole of fluorene bisphenol and, when needed, a solvent such as methanol, ethanol, or 1-methoxy-2-propanol in an amount, e.g., up to about twice the weight of fluorene bisphenol, necessary to insure solution of the fluorene bisphenol. The temperature of the mixture is raised to 50 to 100° C and about 0.8 to 2.5 moles of concentrated (40 to 50 percent by weight) strong aqueous base, e.g., sodium hydroxide or potassium hydroxide, is added over a period of 0.5 to 5.0 hours while continuously removing water under reduced pressure (e.g., about 10 to 50 Torr). These conditions are maintained until analysis indicates the disappearance of the phenolic hydroxy group, generally from 0.5 to 5.0 hours after the completion of the addition of the base. The reaction mixture is filtered to remove akali halide. Excess epihalohydrin and solvent are removed under vacuum. The product, diglycidyl ether of the starting 9,9-bis(4-hydroxyphenyl)fluorene, can then be used directly in the articles of the invention or, where it is a mixture, it can be, if desired, separated into individual diglycidyl ethers by fractional crystallization or chromatography.

Epoxy resin curing agents that can be used in the curable epoxy resin composition of the invention are well known in the art. Included among such curing agents are materials which are preferably acidic or alkaline. Examples of suitable curing agents include, among others, the polybasic acids and their anhydrides, such as, for example, the di-, tri-, and higher carboxylic acids such as oxalic acid; pthalic acid; terepthalic acid; succinic acid; alkyl and alkenyl substituted succinic acids; tartaric acid; and the polymerized unsaturated acids, such as, for example, those containing at least 10 carbon atoms, as for instance, dodecendioic acid; 10,12-eicosadiendioic acid; and anhydrides, such as, for example, pthalic anhydride; succinic anhydride; malic anhydride; nadic anhydride; pyromellitic anhydride; and the like. Generally, from about 0.5 to 2.0 equivalents of acid or anhydride are used per equivalent of epoxy group. With the anhydrides, an optional accelerator, in the range of 0.1 to 5.0 percent by weight of the total resin composition, may be present, e.g., an aromatic tertiary amine such as benzyldimethyl amine.

Other preferred curing agents include the amino-containing compounds, such as, for example, diethylenetriamine; triethylenetetraamine; dicyandiamide; melamine; pyridine; cyclohexylamine; benzyldimethylamine; benzylamine; diethylaniline; triethanolamine; piperidine; tetramethylpiperamine; N,N-dibutyl-1,3-propane diamine; N,N-diethyl-1,3-propane diamine; 1,2-diamino-2-methyl-propane; 2,3-diamino-2-methyl-butane; 2,3-diamino-2-methyl-pentane; 2,4-diamino-2,6-dimethyl-octane; dibutylamine; dioctylamine; and especially the following aromatic polyamines: o-, m-, and p-phenylene diamine; 4,4'-diaminodiphenyl sulfone;

3,3'-diaminodiphenyl sulfone; 4,4'-diaminodiphdeny sulfide; 4,4'-diaminodiphenyl ketone; 4,4'-diaminodiphenyl ether; 4,4'-diaminodiphenyl methane; 1,3-propanediol-bis(4-aminobenzoate); 1,4-bis[α-(4-aminophenyl)-α-methylethyl]benzene (EPON HPT ™-1061, Shell Chemical Co.); 1,4-bis[α-(4-amino-3,5-dimethylphenyl)-α-methylethyl]benzene (EPON HPT ™-1062, Shell Chemical Co.); bis(4-amino-3-methylphenyl)sulfone; 1,1'-biphenyl-3,3'-dimethyl-4,4'-diamine; 1,1'-biphenyl-3,3'-dimethoxy-4,4'-diamine; and diaminonapthalenes.

Also useful as curing agents or supplementary curing agents are Lewis acids such as aluminum trichloride; aluminum tribromide; boron trifluoride; antimony pentafluoride; titanium tetrafluoride; and the like. It is also desirable at times that these Lewis acids be blocked to increase the latency of the compositions containing them. Representative of blocked Lewis acids are $BF_3$-monoethylamine and the adduct $HSbF_5X$, in which X is —OH, halogen, or —$OR^3$ in which $R^3$ is an aliphatic or aromatic group, with aniline or a hindered amine as is described in U.S. Pat. No. 4,503,211.

Where the curing agent is an amino compound there is generally used an amount of amino compound to provide an equivalent concentration of amine hydrogen and epoxy groups. However, amino-containing curing agent sufficient to provide 0.1 to 2.0 or more amine hydrogens per epoxy group can be used. Where the curing agent is based on a Lewis acid, there is used from about 0.1 to 5.0 percent by weight based on total weight of the composition, exclusive of any solvents.

One method of forming the fiber matrix composition of the invention is to mix one or more aromatic polyepoxides, of which at least 10 percent by weight is 9,9-bis[4-(2,3-epoxypropoxy)phenyl]fluorene, or a halogenated derivative thereof, and one or more epoxy curing agents in an organic solvent, such as 1,2-dichloroethane, such that the curable epoxy composition comprises 20 to 80 percent, preferably 40 to 60 percent, by weight of the mixture. This mixture is ball milled 5 to 30, preferably 16 to 20, hours.

The resulting mixture is used to dip coat filaments, fibers, or fabrics. After pulling the filament, fiber, or fabric through the mixture it is drawn between two wiper bars, whose gap setting determines the amount of epoxy resin composition coated onto the reinforcing material. The coated material is dried in air for at least 30 minutes, then at least 50° C for at least 2 minutes.

An alternative method of preparation consists of mixing one or more polyepoxide components, of which at least 10 percent by weight is 9,9-bis[4-(2,3-epoxypropoxy)phenyl]fluorene, or a halogenated derivative thereof, and one or more epoxy curing agents. The curing agent(s) is dissolved, with heating if necessary, and the mixture is degassed, either during mixing or immediately afterwards. This epoxy resin composition is used to hot melt prepreg filaments, fibers, or fabrics. Curing of the laminated structure takes place during the lamination procedure which includes heating in the temperature range of 50 to 250° C.

The prepreg from either method of preparation above can be laminated to provide fiber reinforced composite structures. Standard lamination procedures can be used to make the laminates such as vacuum bag lamination, press lamination, roll lamination, etc. The laminates are useful as circuit boards, structural components, and the like.

Various adjuvants can also be added to the epoxy resin composition to alter the characteristics of either the uncured or cured composition, or both. Included among useful adjuvants are thixotropic agents such as fumed silica; pigments to enchance color tones such as ferric oxide, brick dust, carbon black, and titanium oxide; fillers such as silica, magnesium sulfate, calcium sulfate, and beryllium aluminum silicate; clays such as bentonite; glass beads and bubbles; thermoplastic polymers; and rubbery heterophases. Amounts of up to about 100 parts by weight of adjuvant per 100 parts by weight of epoxy resin composition can be used, depending on the particular adjuvant.

This invention finds utility where fiber reinforced composite structures encounter elevated temperatures due to required manufacturing, testing, or operating conditions. Incorporation of a 9,9-bis[4-(2,3-epoxypropoxy)phenyl]fluorene which is free of ortho substitution, or a halogenated derivative thereof, leads to improved glass transition temperatures in the cured epoxy resin composition as compared to cured epoxy resin compositions which do not contain said fluorene-derived epoxies. This improvement of $T_g$ aids in retention of the structural properties and integrity of said composite structures upon their exposure to elevated temperatures. The composite structures can be, for example, structural composites or printed wiring boards.

Objects and advantages of this invention are further illustrated by the following examples, but the particular materials and amounts thereof recited in these examples, as well as other conditions and details, should not be construed to unduly limit this invention.

In the examples all parts and percents are by weight and temperatures are degrees Centigrade unless otherwise noted. Glass transition temperatures of the cured composite structures were determined by dynamic analysis using a Rheometrics ™ Dynamic Analyzer (Rheometrics, Inc.)(RDA) in the torsion-rectangular mode. The $T_g$ was taken as the major peak of the loss modulus curve (G"), in the temperature range between the glassy and rubbery states; this transition often is called the "alpha" transition.

EXAMPLES

Examples 1-3 demonstrate the use of a dip coating procedure to produce fiber matrix composites and, further, show that the incorporation of 9,9-bis[4-(2,3-epoxypropoxy)phenyl]fluorene (DGEBF) into the matrix resin leads to improved glass transition temperature values compared to fiber matrix composites which do not contain the fluorene epoxy in the matrix composition.

EXAMPLE 1

To a mixture of 500 g of diglycidyl ether of bisphenol A (DGEBA, Epoxy Equivalent Weight (EEW)=173.7 g) and 230 g of 1,2-dichloroethane (EERDCE) was added 270 g of 4,4'-diaminodiphenyl sulfone (DDS, Amine Equivalent Weight (AEW)=62.5 g). The mixture was ball milled for 8 hours, resulting in a dispersion with a viscosity of 1900 cP (centipoise) (Brookfield #3 spindle, 10 rpm).

A 30.5 cm (12 inch) wide strip of plain weave E-glass (type 7628, 203 g/m$^2$) was coated with this dispersion to give 37.2% resin (w/w), by dip-coating the fabric, pulling between two wiper bars, air drying at least 30 minutes at room temperature, and, finally, oven drying at 90° C for 15 minutes. A very tacky prepreg was obtained. A 10-ply composite lay-up (8.3×8.9 cm) was prepared via curing in a laboratory autoclave. The composite was inserted into the pre-heated (100° C) autoclave, held at that temperature (without pressure) for 10 minutes, followed by ramping up to 155° C at 2° C/minute; 42.5 minutes after reaching 155° C, pressure of 340 kPa (50 psi) was applied, and after a total time of 90 minutes at 155° C the temperature was raised to 180° C over 30 minutes and held at that temperature for 2 hours. The sample was then transferred to an oven preheated to 225° C and post-cured 1 hour. Visual inspection of the of the cured composite showed it to be free of voids. Based on the reinforcement fabric area weight, the resin comprised 52.0% (v/v) of the cured composite. The $T_g$ of this cured composite was 204° C by RDA.

EXAMPLE 2

To a mixture 507 g DGEBA/DGEBF (50/50 w/w, EEW=203.7 g) and 218 g EERDCE was added 233 g DDS (AEW=62.5). This mixture was ball milled 8 hours and the thick dispersion was diluted with 65 g of additional EERDCE to give a viscosity of 200 cP.

A 30.5 cm-wide (12 inch-wide) strip of plain weave E-glass (type 7628) was coated and dried by a similar technique as described in Example 1 to give 36.6% resin (w/w). A slightly tacky prepreg was obtained. A 10-ply composite lay-up (8.3×8.9 cm) was prepared and cured using a procedure similar to that given in Example 1, except that pressure was applied 57.5 minutes after reaching 155° C. Visual inspection of the cured composite showed it to be free of voids. The resin comprised 53.2% (v/v) of the cured composite. The $T_g$ of the cured composite was 225° C by RDA.

EXAMPLE 3

To a mixture of 356 g DGEBF (EEW=237.6 g) and 500 g DCE was added 144 g of DDS (AEW=62.5 g) curative. The mixture was ball milled for 24 hours, and the resulting pastey mixture was diluted with 250 g additional DCE; 10 g of silica flow-control (Cab-O-Sil TM M5, Grade TS-720, Cabot) was also added.

A 30.5 cm (12 inch) wide strip of plain weave E-glass (type 1080, 49.2 gm/m²) was coated and dried to give 66.4% resin (w/w) using a dip coating procedure similar to that described in Example 1, except that the oven drying step was done at 177° C for 5 minutes. The resulting prepreg was a non-tacky, glassy material.

A 30-ply composite (6.3×6.5 cm) was prepared using a procedure similar to that used in Example 1. The lay-up was inserted into a laboratory autoclave which was preheated to 180° C, and after 15 minutes a pressure of 340 kPa (50 psi) was applied. After curing for 2 hours under these conditions the sample was removed and post-cured for 1.5 hours in an oven preheated to 225° C. The resin comprised 73.7% (v/v) of the cured composite. The $T_g$ of the cured composite was 256° C by RDA.

Examples 4–13 demonstrate the preparation of fiber matrix composites by hot melt prepregging and, further, show that the incorporation of 9,9-bis[4-(2,3-epoxypropoxy)phenyl]fluorene (DGEBF) into the matrix resin leads to improved glass transition temperature values compared to fiber matrix compositions which do not contain DGEBF.

EXAMPLE 4

(Comparative)

A mixture of 1000 g of DGEBA (EEW=175 g) and DDS (AEW=62 g) was stirred at 120° C under vacuum until the DDS had dissolved. A Research Tool D-30 Hot Melt Prepregger was used to produce a 12 inch by 6 feet piece of prepreg using graphite fibers (T-40 TM, Amoco). A 20-ply composite lay-up 13×18 cm (5×7 in) was prepared and cured in a laboratory mini-autoclave. The cure cycle was as follows: a temperature ramp from room temperature to 177° C at 2.8° C/minute. A vacuum was applied initially and then released when the laminate reached 60° C. Once the laminate reached 177° C the autoclave was pressurized to 590 kPa (85 psi); these conditions were held for 4 hours. Upon completion of this dwell period the laminate was cooled slowly under pressure to ambient temperature. The laminate was then removed and post-cured an additional 2 hours at 225° C in an air-circulating oven. A resin volume of 40% (v/v) was obtained. A $T_g$ of 218° C was found for the cured composite by RDA.

EXAMPLE 5

1000 g of a mixture of DGEBA/DGEBF (65/35 w/w, EEW=194 g) and 320 g of DDS (AEW=62 g) were stirred at 120° C under vacuum until the DDS had dissolved. As in Example 4, the D-30 prepregger was used to produce a piece of prepreg 30.5 cm (12 inches) wide and 183 cm (6 feet) long containing Amoco T-40 graphite fibers. A 20-ply laminate 13×18 cm (5×7 in.) was prepared as in Example 4, and the resulting cured composite contained 40% resin (v/v). The $T_g$ by RDA was 238° C.

EXAMPLE 6

(Comparative)

Using the same epoxy resin components, quantities and procedure as in Example 4 but with polyamide fibers (Kevlar TM -49, Dupont), a cured composite containing 40% resin (v/v) was obtained which had a $T_g$ of 188° C by RDA.

EXAMPLE 7

Using the same epoxy resin components, quantities and procedure as in Example 5 but with Dupont Kevlar TM 49 polyamide fibers, a cured composite containing 40% resin (v/v) was obtained which had a $T_g$ of 202° C by RDA.

EXAMPLE 8

(Comparative)

Using the same epoxy resin components, quantities and procedure as in Example 4 but glass fibers (1062 K198 *glass fibers, PPG), a cured composite containing* 40% resin (v/v) was obtained which had a $T_g$ of 217° C by RDA.

EXAMPLE 9

Using the same epoxy resin components, quantities and procedure as in Example 5 but with PPG 1062 glass fibers, a cured composite containing 40% (v/v) was obtained which had a $T_g$ of 246° C by RDA.

EXAMPLE 10

(Comparative)

A mixture of 325 g DGEBA (EEW=175 g) and 143 g of 1,3-propanediol-bis(4-aminobenzoate) (PDAB, AEW =71.5 g) was stirred at 82° C under vacuum until the PDAB had dissolved. The procedure described in Example 4, with one exception, was used to produce prepreg and laminate using Amoco T-40 graphite fibers. During autoclaving of the 20-ply lay-up however, the autoclave was pressurized to 590 kPa (85 psi) at 121° C instead of 177° C as in Example 4. A cured composite containing 40% resin (v/v) was obtained which had a T TM of 142° C by RDA.

EXAMPLE 11

A mixture of 350 g DGEBA/DGEBF (65/35 w/w, EEW=194 g) and 128 g PDAB (AEW =71.5 g) was stirred at 82° C under vacuum until the PDAB had dissolved. The same procedure as given in Example 10 was used to produce prepreg and laminate using Amoco T-40 graphite fibers. The cured composite contained 40% resin (v/v) and had a $T_g$ of 187° C by RDA.

EXAMPLE 12

(Comparative)

A mixture of 500 g of DGEBA (EEW×175) and 15 g of boron-trifluoride:monoethylamine (BF$_3$: MEA) complex (3% w/w) was stirred in a flask, under a vacuum, at 82° C until the BF$_3$:MEA had dissolved. The same procedure as given in Example 10 was used to produce prepreg and laminate using Amoco T-40 graphite fibers. The cured composite contained 40% resin (v/v), and had a T$_g$ of 162° C by RDA.

EXAMPLE 13

A mixture of 500 g of DGEBA/DGEBF (65/35 w/w, EEW=194) and 15 g BF$_3$::MEA (3% w/w) was stirred in a flask, under vacuum, at 82° C until the BF$_3$:MEA had dissolved. The same procedure as given in Example 10 was used to produce prepreg and laminate using Amoco T-40 graphite fibers. The cured composite contained 40% resin (v/v), and had a T$_g$ of 183° C by RDA.

Various modifications and alterations of this invention will become apparent to those skilled in the art without departing from the scope and spirit of this invention, and it should be understood that this invention is not to be unduly limited to the illustrative embodiments set forth herein.

We claim:

1. A fiber reinforced composite structure having when cured a glass transition temperature greater than 150° C comprised of:
   (a) reinforcing fiber and
   (b) a curable epoxy resin composition comprising
      (i) one or more epoxides having more than one epoxide group per molecule, of which epoxides at least 10 percent by weight is a 9,9-bis[4-(2,3-epoxypropoxy)phenyl]fluorene, all of the fluorane epoxy present being free of ortho substitution; and
      (ii) an effective amount of one or more epoxy curing agents,
   wherein said epoxy curing agent is selected from the group consisting of polybasic carboxylic acids and their anhydrides; aliphatic, cycloaliphatic, and aromatic amines; carboxylic acid amides; and melamines; said epoxy resin composition being free of fluorene-containing amine curing agents.

2. The composite structure of claim 1, further comprising at least one adjuvant selected from the class consisting of thixotropic agents, pigments, fillers, thermoplastic polymers, and rubbery heterophases, these adjuvants being present in an amount sufficient for their intended purposes.

3. The composite structure of claim 1, wherein the 9,9-bis[4(2,3epoxypropoxy)phenyl]fluorene has the structural formula

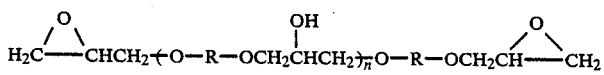

wherein
n is a number having a value of 0 to 3 and
R is a divalent organic group having the structural formula

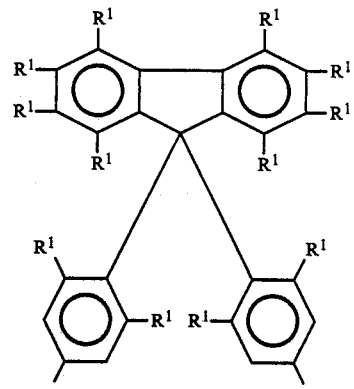

wherein each R$^1$ is independently hydrogen, halogen, or lower alkyl.

4. The composite structure according to claim 1, wherein said epoxide having more than one epoxide group per molecule is selected from the group consisting of polyglycidyl ethers of aliphatic polyols, cycloaliphatic polyepoxides, polyglycidyl ethers of polyhydric phenols and their halogenation products, and polyglycidyl ethers of novolacs.

5. The composite structure according to claim 1, wherein said non fluorene-containing epoxide having more than one epoxide group is selected from the group consisting of di- and polyglycidyl derivatives of aromatic amines, polyglycidyl derivatives of aromatic aminophenols, and glycidyl esters of aromatic polycarboxylic acids.

6. The composite structure according to claim 1 wherein said reinforcing fiber is selected from the class consisting of glass fibers, ceramic fibers, and synthetic organic fibers.

7. The composite structure according to claim 1, wherein said reinforcing fiber is selected from the class consisting of glass fibers, carbon fibers, graphite fibers, silicon carbide fibers, boron fibers, polyester fibers, polyamide fibers, ceramic fibers, rayon fibers, polybenzimidazole fibers, and polybenzothiazole fibers.

8. The composite structure of claim 1 wherein said fibers are metal coated.

9. The composite structure according to claim 8 wherein said metal coated fiber is at least one of nickel- and silver-coated graphite fiber.

10. The composite structure according to claim 1, wherein the epoxy resin composition has been cured.

11. A printed wiring board comprising the cured composite structure according to claim 10.

12. A fiber reinforced composite structure having when cured a glass transition temperature greater than 150° comprised of:
   (a) reinforcing fiber and
   (b) a curable epoxy resin composition comprising
      (i) one or more epoxides having more than one epoxide group per molecule, of which epoxides at least 10 percent by weight is a 9,9-bis[4-(2,3-epoxypropoxy)phenyl]fluorene, all of the fluorene epoxy present being free of ortho substitution; and (ii) an effective amount of one or more epoxy curing agents, wherein said 9,9bis[4-(2,3-epoxypropoxy)phenyl]fluorene is substituted by at least one halogen atom.

13. A composite structure having when cured a glass transition temperature greater than 150° C comprised of:
(a) reinforcing fiber and (b) a curable epoxy resin composition comprising
   (i) one or more epoxides having more than one epoxide group per molecule, of which epoxides at least 10 percent by weight is a 9,9-bis[4-(2,3-epoxypropoxy)phenyl]fluorene, all of the fluorene epoxy present being free of ortho substitution; and
   (ii) an effective amount of one or more epoxy curing agents, wherein the epoxy curing agent is a non-fluorene-containing aromatic amine.

14. The composite structure according to claim 13 wherein said aromatic amine is 4,4'-diaminodiphenyl sulfone.

15. The composite structure according to claim 13 wherein said aromatic amine is 3,3'-diaminodiphenyl sulfone.

16. The composite structure according to claim 13 wherein said aromatic amine is 1,3-propanediol-bis(4-aminobenzoate).

17. The composite structure according to claim 13 wherein said aromatic amine is 1,4-bis[alpha-(4-aminophenyl)-alpha-methylethyl]benzene.

18. The composite structure according to claim 13 wherein said aromatic amine is 1,4-bis[alpha(4-amino-3,5-dimethylphenyl)-alpha-methylethyl]benzene.

19. The composite structure according to claim 13 wherein said curing agent is selected from the group consisting of o-, m-, and p-phenylene diamine; 4,4'-diaminodihenyl sulfone; 3,3'-diaminodiphenyl sulfone; 4,4'-diaminodiphenyl sulfide; 4,4'-diaminodiphenyl ketone; 4,4'-diaminodiphenyl ether; 4,4'-diaminodiphenyl methane; 1,3-propanediiol-bis(4-aminobenzoate); 1,4-bis[α-(4-aminophenyl)-α-methlethyl]benzene; 1,4-bis[α(4-amino-3,5-dimethylphenyl)-α-methylethyl]benzene; bis (4-amino-3-methylphenyl)sulfone; 1,1'-biphenyl-3,3'-dimethyl-4,4'-diamine; 1,1'-biphenyl-3,3'-dimethoxy-4,4'-diamine; and diaminonaphthalenes.

20. The composite structure according to claim 13 further comprising a Lewis acid as a supplementary curing agent.

21. The composite structure according to claim 13 further comprising a supplementary curing agent selected from the group consisting of aluminum trichloride, aluminum tribromide, boron trifluoride, antimony pentafluoride, and titanium tetrafluoride.

22. A composite structure having when cured a glass transition temperature greater than 150° C comprised of:
(a) reinforcing fiber and
(b) a curable epoxy resin composition comprising
   (i) one or more epoxides having more than one epoxide group per molecule, of which epoxides at least 10 percent by weight is a 9,9-bis[4-(2,3-epoxypropoxy)phenyl]fluorene, all of the fluorene epoxy present being free of ortho substitution; and
   (ii) an effective amount of one or more epoxy curing agents,
wherein said curing agent is a polybasic carboxylic acid or its anhydride, polymerized unsaturated acid or its anhydride, or a carboxylic acid amide, said composition being free of fluorene-containing amine curing agents.

23. A fiber reinforced composite structure having when cured a glass transition greater than 150° C comprised of:
(a) reinforcing fiber and
(b) a curable epoxy resin composition comprising
   (i) one or more epoxides having more than one epoxide group per molecule, of which epoxides at least 10 percent by weight is a 9,9-bis[4-(2,3-epoxypropoxy)phenyl]fluorene, all of the fluorene epoxy present being free of ortho substitution; and
   (ii) an effective amount of one or more blocked derivatives of Lewis acides and bases as curing agents,
   said epoxy resin composition being free of fluorene-containing amine curing agents.

24. The fiber reinforced composite structure according to claim 23 wherein said curing agent is borontrifluoride:monoethylene.

25. The fiber reinforced composite structure according to claim 23 wherein said curing agent is the adduct of $HSbF_5X$ in which X is —OH, halogen, or —$OR^3$ in which $R^3$ is an aliphatic or aromatic group, with aniline or a hindered amine.

* * * * *

UNITED STATES PATENT AND TRADEMARK OFFICE
CERTIFICATE OF CORRECTION

PATENT NO. : 4,882,370

DATED : November 21, 1989

INVENTOR(S) : Robert C. Jordan et al.

It is certified that error appears in the above-identified patent and that said Letters Patent is hereby corrected as shown below:

Col. 2, line 9, "$T^g$" should read -- $T_g$ --.

Col. 5, line 6, "(4-amino 3,5-dimethylphenyl)" should read -- (4-amino-3,5-dimethylphenyl) --.

Col. 8, line 37, "(EERDCE)" should read -- (DCE) --.

Col. 8, line 68, "EERDCE" should read -- DCE --.

Col. 9, line 3, "EERDCE" should read -- DCE --.

Col. 9, line 3, "200" should read -- 2200 --.

Col. 10, line 20, "polyamide" should read -- polyaramid --.

Col. 10, line 28, "polyamide" should read -- polyaramid --.

Col. 10, line 37, "$K^{198}$" should read -- $K^{TM}$ --.

Col. 10, line 59, "TTM" should read -- $T_g$ --.

Col. 11, line 4, "x" should read -- = --.

Col. 11, line 15, "::" should read -- : --.

Col. 11, line 54, "9,9-bis[4(2,3epoxypropoxy)phenyl]-fluorene" should read -- 9,9-bis[4-(2,3-epoxypropoxy)-phenyl]fluorene --.

UNITED STATES PATENT AND TRADEMARK OFFICE
CERTIFICATE OF CORRECTION

PATENT NO. : 4,882,370
DATED : November 21, 1989
INVENTOR(S) : Robert C. Jordan et al.

It is certified that error appears in the above-identified patent and that said Letters Patent is hereby corrected as shown below:

Col. 12, line 38, after "1" kindly delete -- , --.

Col. 13, line 34, "1,4-bis[alpha(4-amino-" should read -- 1,4-bis[alpha-(4-amino- --.

Signed and Sealed this

Twenty-eighth Day of December, 1993

Attest:

BRUCE LEHMAN

Attesting Officer     Commissioner of Patents and Trademarks